(12) United States Patent
Tanaka et al.

(10) Patent No.: US 11,127,514 B2
(45) Date of Patent: Sep. 21, 2021

(54) SUPERCONDUCTING WIRE, SUPERCONDUCTING COIL, MRI AND NMR

(71) Applicant: Hitachi, Ltd., Tokyo (JP)

(72) Inventors: Hideki Tanaka, Tokyo (JP); Kazuya Nishi, Tokyo (JP); Takaaki Suzuki, Tokyo (JP); Yota Ichiki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 147 days.

(21) Appl. No.: 15/746,871

(22) PCT Filed: Jul. 24, 2015

(86) PCT No.: PCT/JP2015/071051
§ 371 (c)(1),
(2) Date: Jan. 23, 2018

(87) PCT Pub. No.: WO2017/017715
PCT Pub. Date: Feb. 2, 2017

(65) Prior Publication Data
US 2019/0295746 A1    Sep. 26, 2019

(51) Int. Cl.
*H01B 12/10*         (2006.01)
*G01R 33/3815*    (2006.01)
(Continued)

(52) U.S. Cl.
CPC ............. *H01B 12/10* (2013.01); *C01B 35/04* (2013.01); *G01R 33/3815* (2013.01);
(Continued)

(58) Field of Classification Search
CPC ...... H01B 12/10; H01B 1/02; H01B 13/0036; H01B 12/04; C01B 35/04;
(Continued)

(56) References Cited

U.S. PATENT DOCUMENTS 7,684,839 B2    3/2010 Takahashi et al.
2002/0173428 A1*  11/2002 Thieme ................. H01L 39/141
                                                                    505/100
(Continued)

FOREIGN PATENT DOCUMENTS

JP    2000-113748 A    4/2000
JP    2004-319201 A    11/2004
(Continued)

OTHER PUBLICATIONS

Extended European Search Report issued in counterpart European Application No. 15899549.8 dated Jan. 31, 2019 (nine (9) pages).
(Continued)

*Primary Examiner* — Melissa J Koval
*Assistant Examiner* — Trung Q Nguyen
(74) *Attorney, Agent, or Firm* — Crowell & Moring LLP

(57) ABSTRACT

It is an object of the present invention to provide an $MgB_2$ wire helping to achieve compatibility between the ease with which superconducting connection is effected and thermal stability. A superconducting wire according to the present invention includes: an elemental wire formed of $MgB_2$; and a first metal not reacting with Mg. In a section orthogonal to the longitudinal direction of the superconducting wire, the region extending from the center of the superconducting wire to the installation position of the elemental wire is formed by the elemental wire and the first metal.

13 Claims, 4 Drawing Sheets

(51) Int. Cl.
*H01F 6/06* (2006.01)
*H01B 12/04* (2006.01)
*C01B 35/04* (2006.01)

(52) U.S. Cl.
CPC .............. *H01B 12/04* (2013.01); *H01F 6/06* (2013.01); *C01P 2006/40* (2013.01); *Y02E 40/60* (2013.01)

(58) Field of Classification Search
CPC ........ C01B 2203/1023; G01R 33/3815; G01R 31/50; H01F 6/06; H01F 6/00; C01P 2006/40; H01L 27/18; H01L 39/223; H01L 39/141
USPC ....... 324/600, 633–708, 71.1, 300–322, 263, 324/76.11, 76.49, 76.51; 427/123, 129, 427/271, 384, 255.6, 250, 535–539
See application file for complete search history.

(56) References Cited

U.S. PATENT DOCUMENTS

| | | | |
|---|---|---|---|
| 2003/0207765 A1 | 11/2003 | Bower et al. | |
| 2004/0204322 A1* | 10/2004 | Tanaka | H01L 39/2487 505/100 |
| 2005/0090403 A1* | 4/2005 | Raber | H01L 39/2487 505/100 |
| 2008/0274902 A1* | 11/2008 | Yamada | H01L 39/141 505/231 |
| 2015/0111755 A1 | 4/2015 | Kodama et al. | |
| 2015/0228391 A1 | 8/2015 | Kodama et al. | |
| 2016/0086707 A1* | 3/2016 | Hahn | H01F 6/06 335/216 |
| 2016/0293296 A1* | 10/2016 | Ichiki | H01L 39/141 |

FOREIGN PATENT DOCUMENTS

| | | |
|---|---|---|
| JP | 2005-129529 A | 5/2005 |
| JP | 2006-107841 A | 4/2006 |
| JP | 2006-174546 A | 6/2006 |
| JP | 2012-59511 A | 3/2012 |
| JP | 2013-229237 A | 11/2013 |
| JP | 2013-257970 A | 12/2013 |
| JP | 2014-45158 A | 3/2014 |
| WO | WO 2005/088651 A1 | 9/2005 |
| WO | WO 2014/034295 A1 | 3/2014 |
| WO | WO 2015/015627 A1 | 2/2015 |

OTHER PUBLICATIONS

International Search Report (PCT/ISA/210) issued in PCT Application No. PCT/JP2015/071051 dated Oct. 20, 2015 with English translation (5 pages).
Japanese-language Written Opinion (PCT/ISA/237) issued in PCT Application No. PCT/JP2015/071051 dated Oct. 20, 2015 (4 pages).
Japanese-language Office Action issued in counterpart Japanese Application No. 2017-530462 dated Oct. 9, 2018 with English translation (six (6) pages).
Japanese-language Office Action issued in counterpart Japanese Application No. 2017-530462 dated May 28, 2019 with unverified English translation (five pages).

* cited by examiner

SUPERCONDUCTING WIRE, SUPERCONDUCTING COIL, MRI AND NMR

TECHNICAL FIELD

The present invention relates to a superconducting wire, a superconducting coil, an MRI, and an NMR.

BACKGROUND ART

When, in an MRI or the like, a strong and stable magnetic field is required, a superconducting closed circuit is formed by a superconducting coil and a persistent current switch, and a substantially non-attenuating electric current is supplied to this closed circuit, whereby a desired magnetic field is obtained. To form a superconducting closed circuit, it is necessary to provide a superconducting connection connecting superconducting wires to each other at a minute electrical resistance.

Due to the recent development of an $MgB_2$ superconductor in the form of a wire, it has become possible to prepare a superconducting coil using $MgB_2$. One of the features of the $MgB_2$ superconductor is a high critical temperature of approximately 39 K, making it possible to maintain the superconducting state without involving cooling to the liquid helium temperature of 4.2 K. In the case where this feature is to be utilized, the $MgB_2$ superconducting coil is often used at a temperature of 10 K or more. To form a superconducting closed circuit including this coil, it is necessary to effect superconducting connection between $MgB_2$ wires, and the temperature of the connection portion is often set to 10 K or more in conformity with the temperature of the wire/coil portion. Thus, there is a demand for superconducting connection between $MgB_2$ wires using $MgB_2$.

There are various methods of connecting $MgB_2$ wires to each other. What is common to substantially all the connecting methods is that the end portions of two wires to be connected together are put in a container and heated. In this process, copper arranged on the outer side of the wires is often polished physically or chemically. On the other hand, copper arranged on the inner side of the wires is hard to polish or incapable of being polished.

For example, Patent Document 1 discloses an $MgB_2$ wire using a low resistance material for the core of the wire. Oxygen-free copper is often used as this low resistance material.

PRIOR ART DOCUMENT

Patent Document

Patent Document 1: JP-2012-59511-A

SUMMARY OF THE INVENTION

Problem to be Solved by the Invention

From the result of the study to this day, it has become clear that in an $MgB_2$ superconducting wire structure, it is difficult to improve the characteristics of the superconducting connection of the $MgB_2$ wires if a metal other than a BCC metal (a metal having a body centered cubic lattice structure) is contained in the container in which the connection portion is to be formed. On the other hand, a metal other than a BCC metal must be used for the $MgB_2$ wires in order to achieve an improvement in terms of the thermal stability thereof.

It is an object of the present invention to provide an $MgB_2$ wire helping to achieve compatibility between the ease with which superconducting connection is effected and thermal stability.

Means for Solving the Problem

To achieve the above object, there is provided, in accordance with the present invention, a superconducting wire including: an elemental wire formed of $MgB_2$; and a first metal not reacting with Mg. In a section orthogonal to the longitudinal direction of the superconducting wire, the region extending from the center of the superconducting wire to the installation position of the elemental wire is formed by the elemental wire and the first metal.

Effect of the Invention

According to the present invention, it is possible to achieve compatibility between the ease with which superconducting connection is effected with an $MgB_2$ superconducting wire and the thermal stability of a superconducting wire.

MODES FOR CARRYING OUT THE INVENTION

In the following, embodiments of the present embodiment will be described with reference to the drawings.

Embodiment 1

<Elemental Wire+First Metal>

Figure 1:
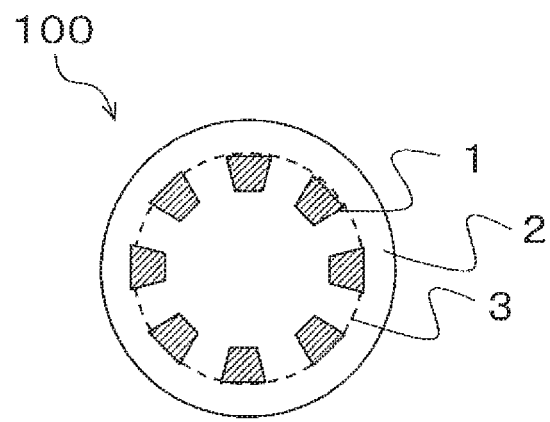
FIG. 1 is a sectional view of a superconducting wire according to embodiment 1.

The section of a superconducting wire 1 orthogonal to the longitudinal direction thereof will be referred to as the cross section. FIG. 1 is a cross-sectional view of a superconducting wire 100 common to the drawings. The superconducting wire 100 includes elemental wires 1 mainly consisting of $MgB_2$ and a first metal 2, with the elemental wires 1 being incorporated into the first metal 2.

In FIG. 1, the outer peripheries of the installation positions of a plurality of elemental wires 1 are connected together by a dotted line. The region extending from the center of the superconducting wire 100 to the dotted line is defined as the "region surrounded by the elemental wires." When, in the cross section, attention is focused on one elemental wire 1, the region from the center of the superconducting wire 100 to the installation position of the elemental wire 1 is formed by the first metal 2. Further, when attention is focused on the plurality of elemental wires 1, the region within the distance range from the center of the superconducting wire 100 to one of the plurality of elemental wires installed farthest from the center is formed by the first metal 2.

By nature, the first metal 2 does not react with Mg. If it reacts with Mg, that will result in deterioration in superconducting characteristics. It is desirable for the first metal 2 employed to exhibit the BCC structure (body centered cubic lattice structure). Preferable examples of such a metal include iron and niobium.

The superconducting wire 100 can be prepared by a plurality of methods. The first preparing method is as follows: A plurality of holes are provided in a columnar iron or niobium material, and the holes are filled with $MgB_2$, magnesium, boron, etc., with wire drawing processing and heat treatment being performed thereon as needed.

The second preparing method is as follows: An iron pipe is filled with $MgB_2$, magnesium, boron, etc., and a plurality of single core wires that have undergone wire drawing processing and heat treatment as needed are bundled together. The iron pipe is filled with these bundled single core wires, and wire drawing processing and heat treatment are executed thereon as needed. The superconducting wire 100 prepared by these methods exhibits substantially the same cross-sectional structure at whatever position it may be cut.

In the cross section of the superconducting wire 100, when copper exists within the region 3 surrounded by the elemental wires, the copper undergoes chemical reaction due to the heating in the superconducting connection process, with the result that the copper or a copper compound is deposited at positions different from the positions where the copper existed before the heating, resulting in generation of gaps in the region 3 surrounded by the elemental wires, thereby impairing the mechanical strength of the wire and hindering the connection between the $MgB_2$ elemental wires. In the present embodiment, no copper exists in the region 3 surrounded by the elemental wires, so that no gaps are generated within this region, and the mechanical strength of the wire is not impaired.

In FIG. 1, the elemental wires 1 are arranged concentrically with respect to the center of the superconducting wire 100. Due to the concentric arrangement of the elemental wires 1, the superconducting characteristic of the superconducting wire 100 is uniform in the cross section, thereby achieving an improvement in terms of the superconducting characteristic of the superconducting wire 100 as a whole.

While in the example of FIG. 1 the number of the elemental wires 1 is eight, in the present embodiment, the superconducting wire 100 is realized so long as there is provided one elemental wire 1. That is, the number of the elemental wires 1 is not restricted to eight. This means at least one elemental wire 1 is needed for the superconducting wire 100 for attaining the requisite superconducting characteristic, with the elemental wire 1 exhibiting a certain degree of area and volume. For example, use of only one elemental wire 1 is acceptable if it has a large cross-sectional area or if it is an elemental wire 1 connected together in a donut-like fashion.

For the thermal stability of the superconducting line 100, there are cases where it is necessary to provide a low resistivity material in the cross section thereof. Iron, which is employed in the present embodiment, can be used as a low resistance material by sufficiently diminishing the impurity concentration thereof. When a material of still lower resistivity such as copper or oxygen-free copper is used, it is possible to enhance the thermal stability as compared with the case where iron is used as the low resistivity material.

The method of preparing a superconducting coil 102 using the superconducting wire 100 of the present embodiment is roughly classified into two methods. The first method is the wind and react technique, in which the superconducting wire 100 is wound around a bobbin, with needed heat treatment being executed thereon afterwards. In this case, as the insulating material provided on the superconducting wire 100, there is used a material withstanding the heat treatment, such as glass fiber. Thereafter, the superconducting wire is fixed in position through resin impregnation or the like as needed. The second method is the react and wind technique, in which heat treatment is executed on the superconducting wire 100, and then the superconducting wire 100 is wound around a bobbin, with the superconducting wire being fixed in position through resin impregnation or the like as needed. In this case, there is no need to perform heat treatment after the winding, so that it is possible to employ an insulating material such as enamel.

Figure 2:
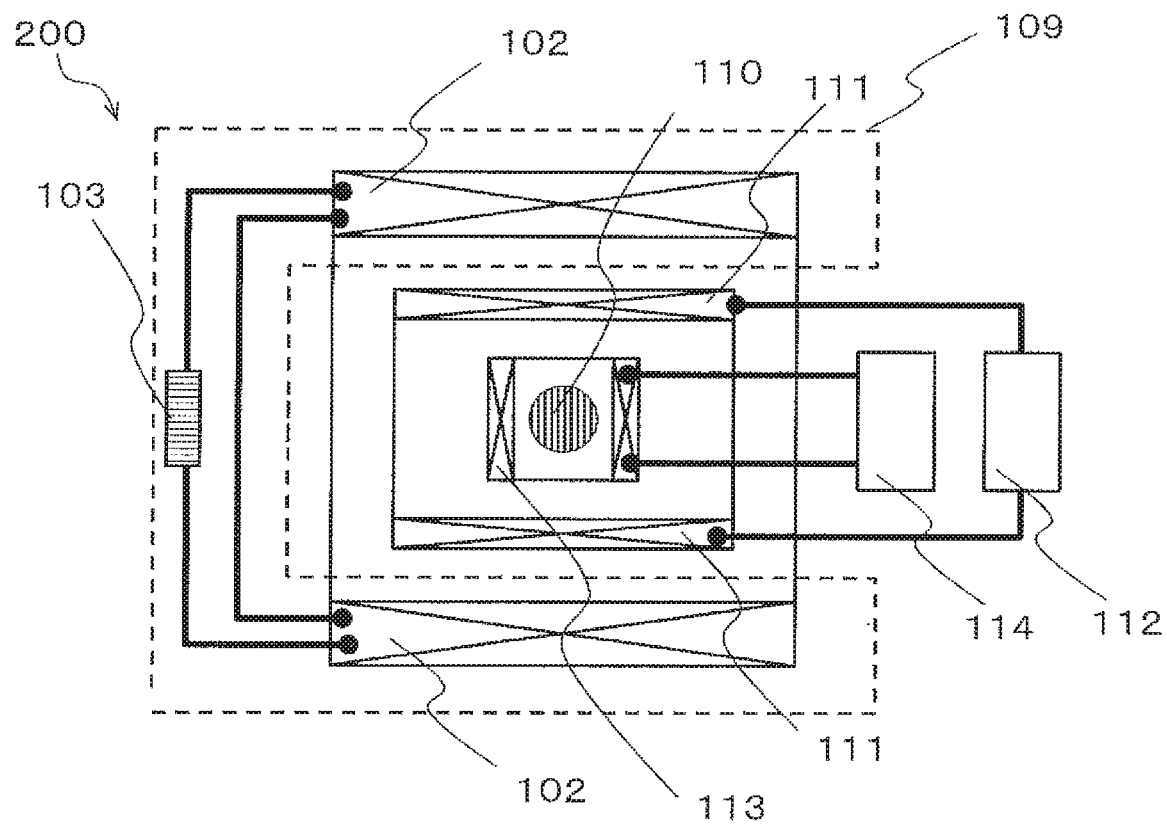
FIG. 2 is a diagram illustrating the construction of an MRI according to embodiment 1.

FIG. 2 shows the construction of an MRI (magnetic resonance imaging apparatus) 200 using the present invention. The superconducting coil 102 using the superconducting wire 100 is accommodated in a refrigerating container 109 together with a persistent current switch 103, and is cooled by a refrigerant or a refrigerator. The persistent current flowing through the superconducting coil 102 and the persistent current switch 103 generates a static magnetic field of high time stability at the position of an object of measurement 110. The higher the strength of this static magnetic field, the higher the nuclear magnetic resonance frequency, and the higher the strength of the nuclear magnetic resonance signal. A gradient magnetic field coil 111 is supplied with an electric current undergoing a change with passage of time from a gradient magnetic field amplifier 112 as needed, generating a static magnetic field having a spatial distribution at the position of the object of measurement 110. Further, by using an RF (radio frequency) antenna 113 and an RF transmitter-receiver 114, a magnetic field of the nuclear magnetic resonance frequency is applied to the object of measurement, and the reaction signal is measured, whereby section imaging diagnosis of the object of measurement 110 is possible.

Figure 3:
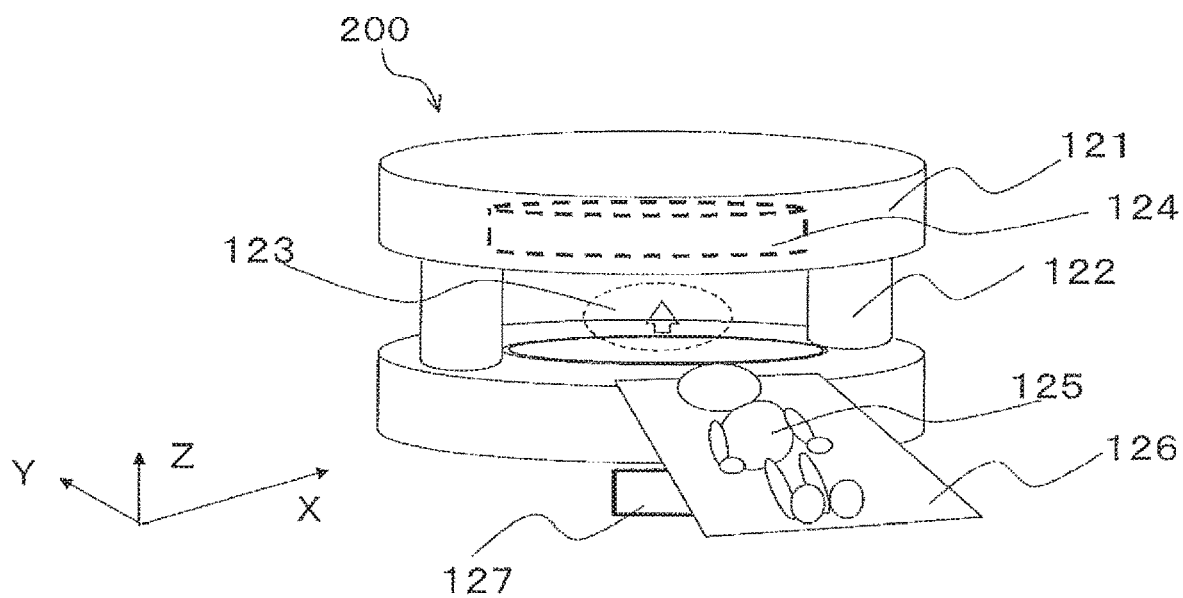
FIG. 3 is a perspective view of the MRI according to embodiment 1.

FIG. 3 is a perspective view of an MRI. An MRI 200 has a pair of static magnetic field generating portions 121 and connection members 122. These are connected together such that the center axis Z indicating the vertical direction constitutes a rotational symmetry axis. The space defined by the pair of static magnetic field generating portions 121 and the connection members 122 is referred to as an imaging region 123. Gradient magnetic field generating portions 124 exist, with the imaging region 123 sandwiched therebetween. Further, the MRI apparatus 120 has a bed 126 on which a subject 125 is to be placed, and conveyance means 127 conveying the subject 125 placed on the bed 126 to the imaging region 123.

The pair of static magnetic field generating portions 121 are equipped with superconducting coils as described in connection with embodiment 1, and generate a static magnetic field by the superconducting coils.

Further, as other components not shown in the perspective view of FIG. 3, the MRI 200 is equipped with an RF (radio frequency) oscillation portion 128 applying to the imaging region 123 an electromagnetic wave of a resonance frequency developing an NMR phenomenon in the subject 125, a reception coil 129 receiving a response signal emitted when an NMR phenomenon is developed and the spin condition of the hydrogen atomic nucleus is changed, a control device 130 controlling each portion of the MRI apparatus 110, and an analysis device 131 processing the signal received to perform analyzing.

The static magnetic field generating portion 121 generates a uniform static magnetic field (uniform magnetic field) in the imaging region 123, and the gradient magnetic field generating portion 124 serves to superimpose a gradient magnetic field on a uniform magnetic field such that the magnetic field strength in the imaging region 123 is inclined. Due to this construction, the MRI apparatus 110 turns the section of the region of interest (usually a slice surface that is 1 mm thick) of the imaging region 123 into an image.

The gradient magnetic field generating portions 124 are arranged in a pair of accommodation spaces provided on the opposing surfaces of the pair of static magnetic field generating portions 121. At the time of the operation of the MRI apparatus 120, the gradient magnetic field generating portions 124 are arbitrarily switched with respect to the three mutually orthogonal directions of the imaging region 123 to superimpose a gradient magnetic field. In this way, the strength of the magnetic field in the imaging region 123 is arbitrarily switched in the three directions orthogonal to each other and is inclined, whereby the three-dimensional position where the NMR phenomenon is developed is clarified.

While the MRI apparatus described above is of the vertical magnetic field type, the construction of the present embodiment is also applicable to an MRI apparatus of the horizontal magnetic field type (not shown).

It is also possible to realize an NMR by using the same construction. The construction of the MRI shown in FIGS. 2 and 3 is only presented by way of example, and should not be construed restrictively.

Embodiment 2

<Elemental Wire+First Metal+Second Metal: Copper>

Figure 4:
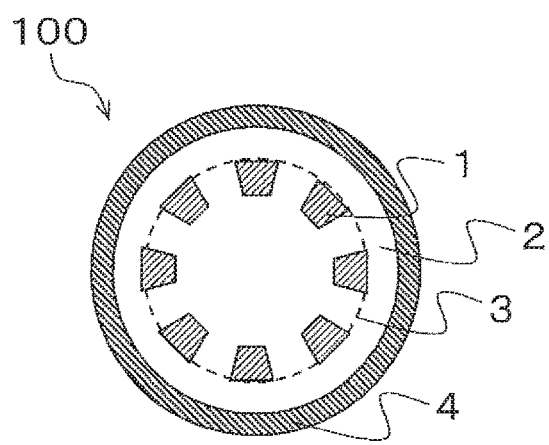
FIG. 4 is a sectional view of a superconducting wire according to embodiments 2 and 3.

Regarding embodiment 2, solely the differences from embodiment 1 will be described. FIG. 4 is a schematic cross-sectional view of the superconducting wire 100 when a second metal 4 is arranged in the outermost layer of the wire. As the second metal, copper is employed, whereby it is advantageously possible to achieve an improvement in terms of the thermal stability of the superconducting wire 100. This is due to the fact that the elemental wire 1 becomes incapable of maintaining the superconducting state, and that the electric resistivity when an electric current flows through the metal is lowered.

As stated in connection with embodiment 1, copper is a metal which reacts with magnesium, so that it is arranged in the outermost layer.

In the superconducting wire 100 of the present embodiment, copper is previously deposited on the iron or niobium material through evaporation or the like in the first preparation method. In the second preparation method, it can be prepared, for example, by filling a copper pipe with a plurality of single core wires bundled together and performing wire drawing processing thereon. In the case where wire drawing processing is performed on a plurality of single core wires bundled together, it is possible to process a long wire on the order of km by using copper as the second metal.

Embodiment 3

<Elemental Wire+First Metal+Second Metal: Copper-Nickel Alloy>

It is also possible to use a copper-nickel alloy as the second metal shown in FIG. 4. By using a metal of high hardness such as copper-nickel alloy, it is possible to improve the mechanical strength of the superconducting wire 100.

In the superconducting wire 100 of the present embodiment, a copper-nickel alloy pipe is previously attached to the outer side of the iron or niobium material in the first preparation method. In the second preparation method, it can be prepared, for example, by filling a copper-nickel alloy pipe with a plurality of single core wires and performing wire drawing processing thereon.

Embodiment 4

<Elemental Wire+First Metal+Second Metal: Copper+Third Metal: Copper-Nickel Alloy>

Figure 5:
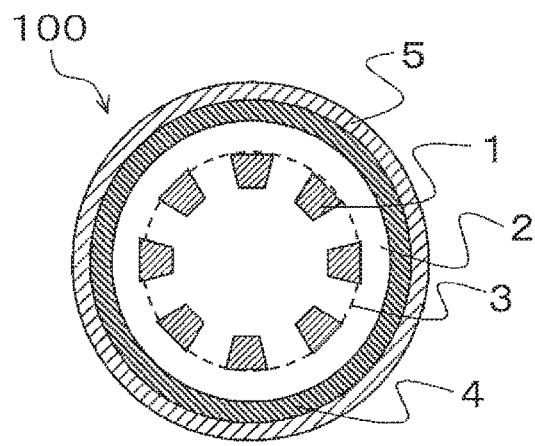
FIG. 5 is a sectional view of a superconducting wire according to embodiments 4 and 5.

FIG. 5 is a schematic cross-sectional view of the superconducting wire 100 when a third metal 5 is arranged in the outermost layer of the wire. By using copper as the second metal, and a metal of high hardness such as a copper-nickel alloy as the third metal, it is possible to achieve compatibility between the suppression of the electric resitivity of the superconducting wire 100 and an improvement in terms of the mechanical strength of the wire.

In the superconducting wire 100 of the present embodiment, copper is previously attached to the outer side of the iron or niobium material and, further, a copper-nickel alloy is previously attached to the outermost layer, in the first preparation method. In the second preparation method, it can be prepared, for example, by superimposing a copper-nickel alloy pipe on the outer layer of a copper pipe filled with a plurality of single core wires and bringing them into close contact with each other at the time of wire drawing processing.

Embodiment 5

<Elemental Wire+First Metal+Second Metal: Copper-Nickel Alloy+Third Metal: Copper>

In the superconducting wire 100 shown in FIG. 5, it is possible to use a metal of high hardness such as a copper-nickel alloy as the second metal 4, and to use copper as the third metal 5, whereby it is possible to achieve compatibility between the suppression of the electric resistivity of the superconducting wire 100 and an improvement in terms of the mechanical strength thereof.

The superconducting wire 100 of the present embodiment can be prepared by performing die drawing processing after wrapping the outer periphery of the superconducting wire 100 shown in embodiment 3 in a copper sheet, or after combining it with a copper material processed to have the cross section of C-shaped. Since the superconducting wire 100 at the time of wire drawing processing does not contain copper, which is soft, the density of the mixture in the elemental wire 1 such as magnesium and boron is raised, whereby it is possible to achieve an improvement in terms of superconducting characteristic.

Embodiment 6

<The Copper in Embodiment 5 is A Gate-Shaped Copper>

Figure 6:
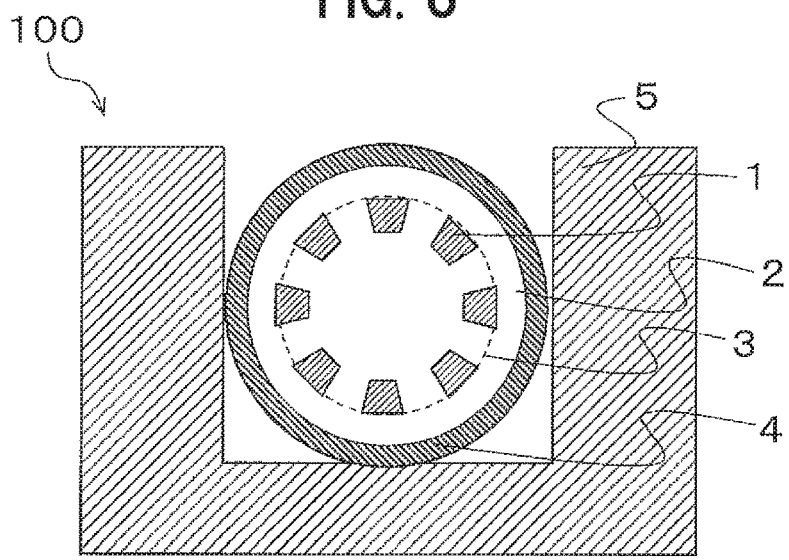
FIG. 6 is a sectional view of a superconducting wire according to embodiment 6.

FIG. 6 is a schematic cross-sectional view of the superconducting wire 100 in the case where the third metal 5 is arranged in the outermost layer such that its section is of a rectangular configuration. By using a metal of high hardness such as copper-nickel alloy as the second metal, and by using copper as the third metal, it is possible to achieve compatibility between the suppression of the electric resistivity of the superconducting wire 100 and an improvement in terms of the mechanical strength thereof. Further, by increasing the volume of the copper, which is the third metal, it is possible to further suppress the electric resistivity.

The superconducting wire 100 of the present embodiment can be prepared by performing die drawing processing after combining the superconducting wire with a gate-shaped recessed copper portion in the outer periphery of the superconducting wire 100 of embodiment 3. Since the superconducting wire 100 at the time of wire drawing processing does not contain copper, which is soft, the density of the mixture in the elemental wire 1 such as magnesium and boron is raised, whereby it is possible to achieve an improvement in terms of superconducting characteristic.

Embodiment 7

<Double Elemental Wire+First Metal+Second Metal>

Figure 7:
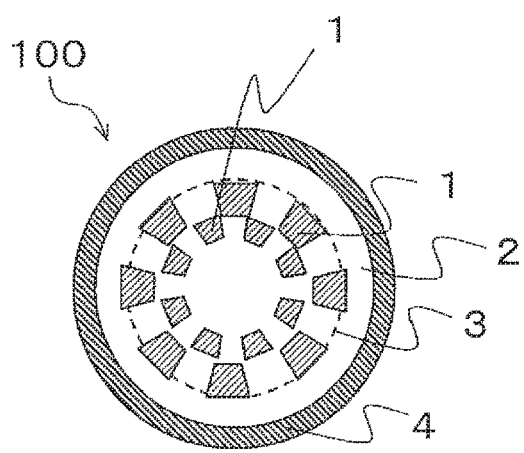
FIG. 7 is a sectional view of a superconducting wire according to embodiment 7.

FIG. 7 is a cross-sectional view of the superconducting wire 100 in the case where the elemental wire 1 is doubly arranged. In the case where the elemental wire 1 is thus doubly arranged, the region 3 surrounded by the elemental wire in the wire-material cross section is defined as the region surrounded by the elemental wire group arranged on the outermost side in cross section, i.e., it is the region indicated by the dotted line of FIG. 5. The preparation method of the present embodiment is the same as that of embodiments 2 and 3. Further, even in the case where the elemental wire 1 is arranged in a further multiple fashion, the definition of the region 3 surrounded by the elemental wire is the same, i.e., the region is the one surrounded by the elemental wire group arranged on the outermost side in the cross section of the wire material. While in FIG. 5 the inner elemental wires are depicted as thinner than the outer elemental wires, this should not be construed restrictively. By arranging the elemental wires 1 in a multiple fashion, the area ratio of the elemental wires 1 in the cross section of the wire is raised, whereby the amount of electric current that can be supplied to the wire is advantageously increased. While in the present embodiment the outermost layer is the second metal 4, the third metal 5 may be added as needed.

Embodiment 8

<Wire Material Having a Rectangular Cross-Sectional Configuration>

Figure 8:
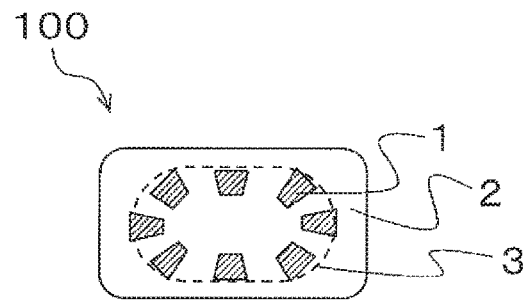
FIG. 8 is a sectional view of a superconducting wire according to embodiment 8.

FIG. 8 is a cross-sectional view of a superconducting wire 100 the cross-sectional configuration of which is not round but rectangular. The components of the superconducting wire 100 are the same as those of embodiment 1. To prepare the wire, a wire drawing processing such as rolling is performed at the end stage of the wire drawing processing of the superconducting wire 100. This helps to increase the density of the elemental wires 1, and to align the orientation of the $MgB_2$ crystal. Further, this advantageously increases the amount of electric current that can be supplied to the wire. While in the present embodiment the outermost layer is the first metal 2, the second metal 4 and the third metal 5 may be added as needed.

Embodiment 9

<Wire Material Having a Rectangular Cross-Sectional Configuration+Second Metal of Round Cross-Sectional Configuration>

Figure 9:
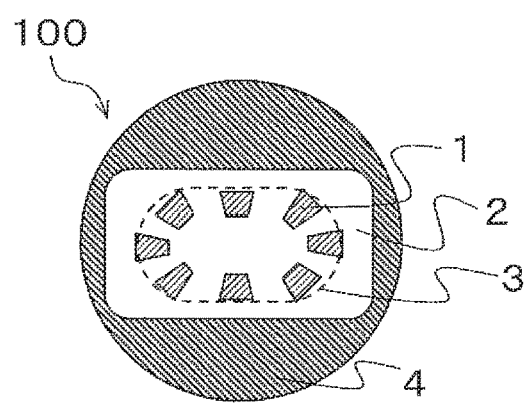
FIG. 9 is a sectional view of a superconducting wire according to embodiment 9.

FIG. 9 is a schematic cross-sectional view of the superconducting wire 100 in the case where the second metal 4 is arranged on the wire of FIG. 8 the cross-sectional configuration of which is rectangular, such that the resultant cross-sectional configuration is round. Like embodiment 2, this embodiment is superior in that it helps to improve the thermal stability of the superconducting wire 100. Due to the round outermost layer, it is also superior in that when it is wound into a coil shape, the winding can be performed with high precision in terms of the wire position. Further, it is superior in that when it is wound into a coil, it is possible to set the orientation of the longer side of the first metal 2, which has longer and shorter sides, to an arbitrary angle with respect to the direction of the coil magnetic field, and that the amount of electric current that can be supplied to the wire is increased in the wire in which the critical current density varies depending on the direction of the magnetic field applied to the wire material due to the orientation of $MgB_2$, etc. The wire of the present embodiment can be prepared by performing die drawing processing after shaping the cross section of the wire into a rectangular configuration and then wrapping the wire in copper sheet, or by performing die drawing after combining the wire shaped into a rectangular configuration with a copper material processed to have the cross section of C-shaped.

Embodiment 10

<Two Wire Materials the Cross-Sectional Configuration of Which is Rectangular+Second Metal the Cross-Sectional Configuration of Which is Round>

Figure 10:
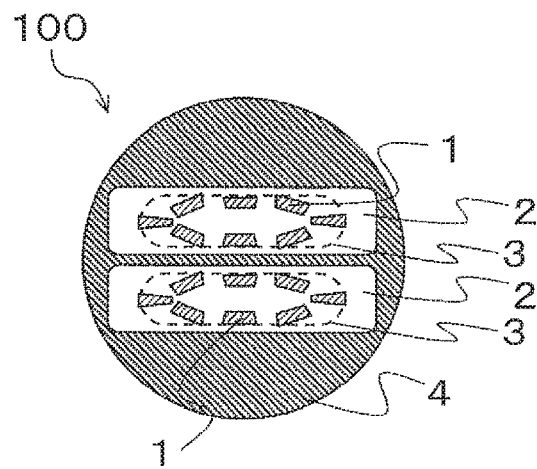
FIG. 10 is a sectional view of a superconducting wire according to embodiment 10.

FIG. 10 is a schematic cross-sectional view of a superconducting wire 100 in the case where a plurality of wires the cross-sectional configuration of which is rectangular are arranged within the second metal 4. The method of preparing this superconducting wire is the same as that of embodiment 5. The present embodiment is superior in that the amount of electric current that can be supplied to the wire is increased.

DESCRIPTION OF REFERENCE CHARACTERS

1: Elemental wire
2: First metal
3: Region surrounded by the elemental wire
4: Second metal
5: Third metal
100: Superconducting wire
102: Superconducting coil
103: Persistent current switch
109: Refrigerating container
110: Object of measurement
111: Gradient magnetic field coil
112: Gradient magnetic field amplifier
113: RF antenna
114: RF transmitter-receiver 121: A pair of static magnetic field generating portions,
122: Connection member
123: Imaging region
124: Gradient magnetic field generating portion
125: Subject
126: Bed
127: Conveyance means
128: RF oscillation portion
129: Reception coil
130: Control device
131: Analysis device
200: MRI

The invention claimed is:

1. A superconducting wire comprising:
a plurality of elemental wires formed of $MgB_2$ and a first metal;
an inner peripheral portion situated at a central portion of the superconducting wire and formed by the plurality of elemental wires and the first metal, wherein no copper is present between the plurality of elemental wires; and
an outer peripheral portion situated on an outer side of the inner peripheral portion and formed of a second metal which is formed by copper and a third metal which is of greater hardness than the first metal,
wherein the first metal is iron or niobium; and
wherein regions existing from a center of the superconducting wire to installation positions of the plurality of elemental wires are formed by the elemental wires and the first metal.

2. The superconducting wire according to claim 1, wherein
the plurality of elemental wires are circularly arranged with respect to the center of the superconducting wire.

3. The superconducting wire according to claim 1, wherein:
the third metal is a copper-nickel alloy.

4. The superconducting wire according to claim 1, wherein
a configuration of the section of the superconducting wire is rectangular or round.

5. A superconducting coil including the superconducting wire as claimed in claim 1.

6. An MRI comprising:
the superconducting coil as claimed in claim 5; and
analysis means analyzing a nuclear magnetic resonance signal from a subject.

7. An NMR comprising:
the superconducting coil as claimed in claim 5; and
analysis means analyzing a nuclear magnetic resonance signal from a subject.

8. The superconducting wire according to claim 1, wherein
the plurality of elemental wires are arranged around only an outer periphery of the inner peripheral portion.

9. The superconducting wire according to claim 8, wherein
the plurality of elemental wires are evenly arranged around the outer periphery of the inner peripheral portion.

10. The superconducting wire according to claim 1, wherein the copper is present in the superconducting wire only in the outer peripheral portion.

11. The superconducting wire according to claim 1, wherein the plurality of elemental wires includes a plurality of inner element wires and a plurality of outer element wires arranged radially outside of the inner element wires.

12. A superconducting wire comprising:
a plurality of elemental wires formed of $MgB_2$ and a first metal;
an inner peripheral portion situated at a central portion of the superconducting wire and formed by the plurality of elemental wires and the first metal, wherein no copper is present between the plurality of elemental wires; and
an outer peripheral portion situated on an outer side of the inner peripheral portion and formed of a second metal which is formed by copper and a third metal which is of greater hardness than the first metal,
wherein the first metal is iron or niobium; and
wherein a region within a distance range from a center of the superconducting wire to the elemental wire of the plurality of elemental wires that is installed farthermost from the center is formed by the elemental wires and the first metal.

13. The superconducting wire according to claim 12, wherein
the plurality of elemental wires are arranged circularly with respect to the center of the superconducting wire.

* * * * *